United States Patent [19]
Matsubara

[11] Patent Number: 5,930,189
[45] Date of Patent: Jul. 27, 1999

[54] SEMICONDUCTOR MEMORY DEVICE HAVING SHORT READ TIME

[75] Inventor: Yasushi Matsubara, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/824,611

[22] Filed: Mar. 27, 1997

[30] Foreign Application Priority Data

Mar. 28, 1996 [JP] Japan ................................... 8-073699

[51] Int. Cl.$^6$ ................................................ G11C 7/00
[52] U.S. Cl. .......................................... 365/205; 365/194
[58] Field of Search ................................... 365/205, 194, 365/207, 208

[56] References Cited

U.S. PATENT DOCUMENTS 5,291,450  3/1994  Fujiwara ................................. 365/205
5,293,338  3/1994  Ihara ..................................... 365/205

*Primary Examiner*—A. Zarabian
*Attorney, Agent, or Firm*—Sughrue, Mion, Zinn, Macpeak & Seas, PLLC

[57] ABSTRACT

A semiconductor memory device disclosed which has an optimized read time in the reading operation. It is realized that both the wiring delay of a control signal bus 903 and a wiring delay of a data signal bus 412 are set equivalently. For example, an amplifier circuit 419 is received a read-out data through the data signal bus 412 and amplifies the read-out data in response to a enable signal 510. In this case, the enable signal 510 is generated by an amplifier control circuit 904 in response to a delay control signal which is through the control bus 903. Since the enable signal 510 which activates the amplifier circuit 419 is generated at a most preferred timing, thereby the data reading-out speed can be increased up to its limit speed.

6 Claims, 11 Drawing Sheets

SEMICONDUCTOR MEMORY DEVICE HAVING SHORT READ TIME

BACKGROUND OF THE INVENTION

1. Field of the Invention

This invention relates to a semiconductor memory device and, more particularly, a semiconductor memory that is optimistically adjusted a period of a data read time from a memory cell.

2. Description of the Related Art

In the semiconductor memory device, it is required increase a data read-out speed during the data reading operation. The data read-out operation includes some operations which selecting a memory cell of a read-out data, transferring the read-out data to internal bus and amplifying the read-out data in order to output. Accordingly, to increase a data read-out speed, a timing of starting-time of each of the operations is had to adjust.

An example of Synchronous DRAM (SDRAM) is as follows. Referring now to FIG. 1, there is shown a timing chart of operation of the SDRAM. The SDRAM latches a command at rising edge of clock signal CLOCK 101. The command is represented by combination of a row address strobe RASB 104, a column address strobe CASB 105 and write enable signal WEB 106. For example, an active command is represented as "RASB=0, CASB=1, WEB=1". In addition, the SDRAM is received a clock enable signal CKE 102 and a chip select signal CSB 103. The CKE 102 activates a command receiver which receives each of the signals 101–108. The CSB 103 selects one bank of the SDRAM from a plurality of banks which arranges on a system board. The SDRAM is received a word address signal X 109 at the same timing of the active command and received a digit address signal Y 110 at the same timing of the read or write command. In a case that a write operation, the SDRAM is received a write-data IN 111 from a data pin DQ 108. Also, a read-data OUT 112 in a read operation is outputted from the DQ 108.

Referring now to FIG. 2, there is shown a diagram of generating method of internal commands. A command receiver 201 is received the command signals, and A latch 208 latches the command signals in response to an internal clock 219 from a clock receiver 202. An internal command generator 214 generates internal commands from the RASB 104, CASB 105 and WEB 106. The X address buffer 215 latches the ADDRESS 107 in response to the active command 220, and the X address decoder 216 generates a word line selecting signal WS 222. Similarly, the Y address buffer 217 latches the ADDRESS 107 in response to the read command 221, and the Y address decoder 218 generates a digit line selecting signal DS 223. The data latch 213 is connected with an internal bus which transfers the read data from the memory cell and write data to thereof.

Referring now to FIG. 3, there is shown a circuit diagram of a memory block. The memory block includes a memory section 301, a sense amplifier register 306, Y switch circuit 310, a word line activate circuit 305, and a first data amplifier 316. Furthermore, the memory section 301 includes word lines 303-1 through 303-n, digit lines 304-1 through 304-n, and memory cells 302-11 through 302-nn which are connected an intersecting point of between each of the word lines and each of the digit lines. In reading operation, at first, the word line activate circuit 305 activates one of the word line in response to the WS 222. In the FIG. 3, the word line 303-i is activated. Accordingly, a data of the memory cells 302-1i through 302-ni are transferred to the sense amplifier resister 306. At the same time, the sense amplifier resister 306 stores the data of the memory cells 302-1i through 302-ni in response to the active command 220. Then, the Y switch circuit 310 selects one of the sense amplifier register in response to the DS 223, and the selected sense amplifier register outputs the stored data to the first data amplifier 316 through a read out line RO 315. Here, the RO 315 is used to another sense amplifier register of another memory block (refer to FIG. 4). The first data amplifier 316 outputs the stored data to a read write bus RWBUS 314 in response to a first data amplifier enable signal FAEN 317.

Referring now to FIG. 4, there is shown a circuit diagram of a prior memory device. In this FIG. 4, the memory device 401 includes four memory banks 402–405. Each of the memory banks includes a plurality of the memory blocks 421-1 through 421-n and 422-1 through 422-n. The first data amplifier 406-1 through 406-n arranges correspondly to the sense amplifier register 424-1 through 424-n and 425-1 through 425-n, respectively. Furthermore, a first data amplifier control circuit 407-1 through 407-n arranges correspondly to the first data amplifier 406-1 through 406-n, respectively. The YSW 426 is used to the memory cells 421-1 through 421-n, and the YSW 427 is used to the memory cells 422-1 through 422-n. A read control circuit 414 as a bank select circuit includes four read control circuits 415–418. Each of the read control circuits selects one bank from each of the banks.

In the case that data is read out from the memory block 421-1 of the bank 1 as follows. The read control circuit 414 is received the read command 221, and the read control circuit 415 generating a first amplifier starting signal FAS 408 in order to read the data from the bank 1. The first data amplifier control circuit 407-1 generates the FAEN 318 in response to the FAS 408. Then, the first data amplifier 406-1 outputs the stored data, or read-out data to the RWBUS 412. On the other hands, the FAS 408 is transferred to a second data amplifier control circuit 420 as a second amplifier starting signal SAS 413. The second data amplifier control circuit 420 generates a second amplifier enable signal SAEN 510 in response to the SAS 413 and outputs the SAEN 510 to a second data amplifier 419. As a results, the read-out data is read to the exterior through the data latch.

In this connection, the second data amplifier must be enabled after arriving the read-out data. Therefore, the second data amplifier control circuit 420 delayed generating the SAEN 510. Referring now to FIG. 5, there is shown a circuit diagram of the read control circuit, the first data amplifier control circuit and the second data amplifier control circuit. The read control circuit 501 is received the read command 221. The read control circuit 501 is comprised of one AND gate and six inverters, the read command 221 is delayed by the inverters of six-stages and outputted thereof as the FAS 507 or the SAS 508. Here, the signal 505 and 506 are block select signals BS which selects the memory block being indicated by the address signal. The first data amplifier control circuit 502 is comprised of two AND gates, one OR gate and three inverters. The FAS 507 is inputted to the AND gate with the BS 506. An output of AND gate is outputted as the FAEN 509 through a feed-back circuit including the OR gate, the AND gate and the inverters of three-stages and then inputted to the first data amplifier. The second data amplifier control circuit 503 is comprised of four inverters, one OR gate, one AND gate, one NAND gate and an activating timing adjusting circuit 504 composed of inverters of a plurality of stages. The SAS 508 to be inputted is inputted to the inverters of two stages, it is outputted with its delay time being adjusted at the activating timing adjusting delay circuit 504 and further inputted to the NAND gate forming the feed-back circuit. An output from the feed-back circuit is delayed in time by a predetermined amount from the SAS 508, outputted as the SAEN 510 and inputted to the second data amplifier. In addition, the number of stages of inverters in the activating timing adjusting circuit 504 is set to be adapted for a desired delay time, thereby the delay time in the activating timing adjusting circuit 504 is accurately fine adjusted and the delay time in the SAEN 510 is set to a predetermined value.

Referring now to FIG. 6, there is shown a circuit diagram of the first data amplifier. The first data amplifier 601 is received the BS 602 and FAEN 603. When the BS 602 becomes the high level and the FAEN 603 becomes low-level, the first data amplifier 601 amplifies the stored data by the sense amplifier register through the RO lines which is ROT 604 and RON 605. Then, the amplified data is outputted to the RWBUS which is RWBUSTj 606 and RWBUSNj 607.

Referring now to FIG. 7, there is shown a circuit diagram of the second data amplifier. The second data amplifier 701 is received the PBTB 702 and SAEN 703. The PBTB 702 indicates a timing of precharging the RWBUS, the RWBUS is prechaged when the PBTB 702 becomes high-level. When the PBTB 702 and SAEN 703 becomes low-level, the second data amplifier 701 amplifies the amplified data by the first data amplifier register through the RWBUSTj 704 and RWBUSNj 705. Then, the amplified data is outputted as the read-out data DATi 706.

Referring now to FIG. 8, there is shown a timing chart of the prior memory device. Assuming that the read command is generated at a timing t0 (A), the FAS and SAS is generated at a timing t1 (B) by the read control circuit 501. At the same time, the memory bank is activated in response to the read command, since the RO is also activated (C). In other words, the read-out data 801 is transferred to the first data amplifier. While the FAEN is generated at a timing t2 (D) by the first data amplifier control circuit 502. Accordingly, the read-out data is transferred to RWBUS in response to the FAEN (E). Then, the read-out data 801 arrives to the second data amplifier at a timing t4 through the RWBUS (F). In this connection, the read-out data is decided at a timing t5. Therefore, the second data amplifier control circuit delayed the SAS and generates the SAEN at a timing t6 (G). As a result, the read-out data 801 is transferred to data latch 213 (refer to FIG. 2) and outputted (H) at a timing t7. That is, a read-out time T2 in which the read-out data 801 is outputted is expressed by T2=(t7−t0).

In the aforesaid prior art semiconductor memory device, it is intended to realize a delay time of the SAEN of which value is quite short in length and requires an accurate adjustment in order to increase a data read-out speed during the data reading operation by the delay circuit 504 within the second data amplifier control circuit 503. It is a requisite condition in the semiconductor memory device to shorten a time until the read-out data 801 is outputted from the second data amplifier after the read command is inputted and to increase a data read-out speed from the memory block, and in order to attain these requirements, it becomes a requisite condition that at the timing for activating the second data amplifier amplifying data on the RWBUS is coincided with the timing of the data. However, a more increased setting of the timing of the SAEN outputted in delay by the second data amplifier control circuit 503 than that required may lead to a reduction in read-out speed of the semiconductor memory device and in the case that a delay time of the SAEN up to the limit point of the timing, there is a possibility that data on the RWBUS is not normally amplified at the second data amplifier and is not outputted normally. Due to this fact, although the delay time of the SAEN is accurately adjusted within the second data amplifier control circuit 503 and outputted as described above, as a practical problem, it is quite difficult to realize an accurate delay circuit due to various kinds of varying causes such as disturbance of the semiconductor element in its manufacturing stage, variation in power supply voltage and variation of surrounding air temperature and the like. Therefore, in the prior art semiconductor memory device, the data can be positively read out by applying a time surplus in an arrangement in which the timing of the SAEN is t5 in respect to the timing t3 of the RWBUS (near the second amplifier) in compliance with the aforesaid various causes.

SUMMARY OF THE INVENTION

As mentioned above, in a case that the circuit deals with a data signal in response to a control signal, a generating timing of the control signal must be corresponded with a arriving timing of the data signal into the circuit. In the prior art, the control signal (or the SAEN) is delayed because of the data signal (or the read-out data) is delayed by a wiring delay. Accordingly, the prior art delayed the control signal by the delay circuit which includes the plurality of inverter circuit. Because a wiring delay of a data signal line (or the RWBUS) differs from a control signal line (or the SAS 413) thereof. However, the delay circuit of the prior art can not adjust the delay time accuracy because of various problems of the semiconductor element occurs. For example, the disturbance of the semiconductor element.

It is, therefore, an object of the present invention to provide a further improved a semiconductor memory device.

It is another object of the present invention to provide a semiconductor memory device which has an optimized read time in the reading operation.

It is still another object of the present invention to provide a semiconductor memory device which has the same wiring delay between a control signal line and a data signal line.

A semiconductor memory device according to present invention is featured by both the wiring delay of a control signal bus 903 and a wiring delay of a data signal bus 412 are set equivalently. In the present invention, assuming that an amplifier circuit 419 is received a read-out data through the data signal bus 412 and amplifies the read-out data in response to a enable signal 510. In this case, the enable signal 510 is generated by an amplifier control circuit 904 in response to a delay control signal which is through the control bus 903. Since the enable signal 510 which activates the amplifier circuit 419 is generated at a most preferred timing, thereby the data reading-out speed can be increased up to its limit speed.

In addition, it may also be preferable that the data signal bus 412 and the control signal bus 903 are defined such that a deviation of resistivity between relative applied raw materials may be less than ±50% and a size deviation between a wiring length and a wiring width may be less than ±50%, respectively.

BRIEF DESCRIPTION OF THE DRAWINGS

The above and other objects, features and advantages of the present invention will be apparent from the following description taken in conjunction with the accompanying drawings, in which.

DETAILED DESCRIPTION OF THE PREFERRED EMBODIMENT

Figure 1:
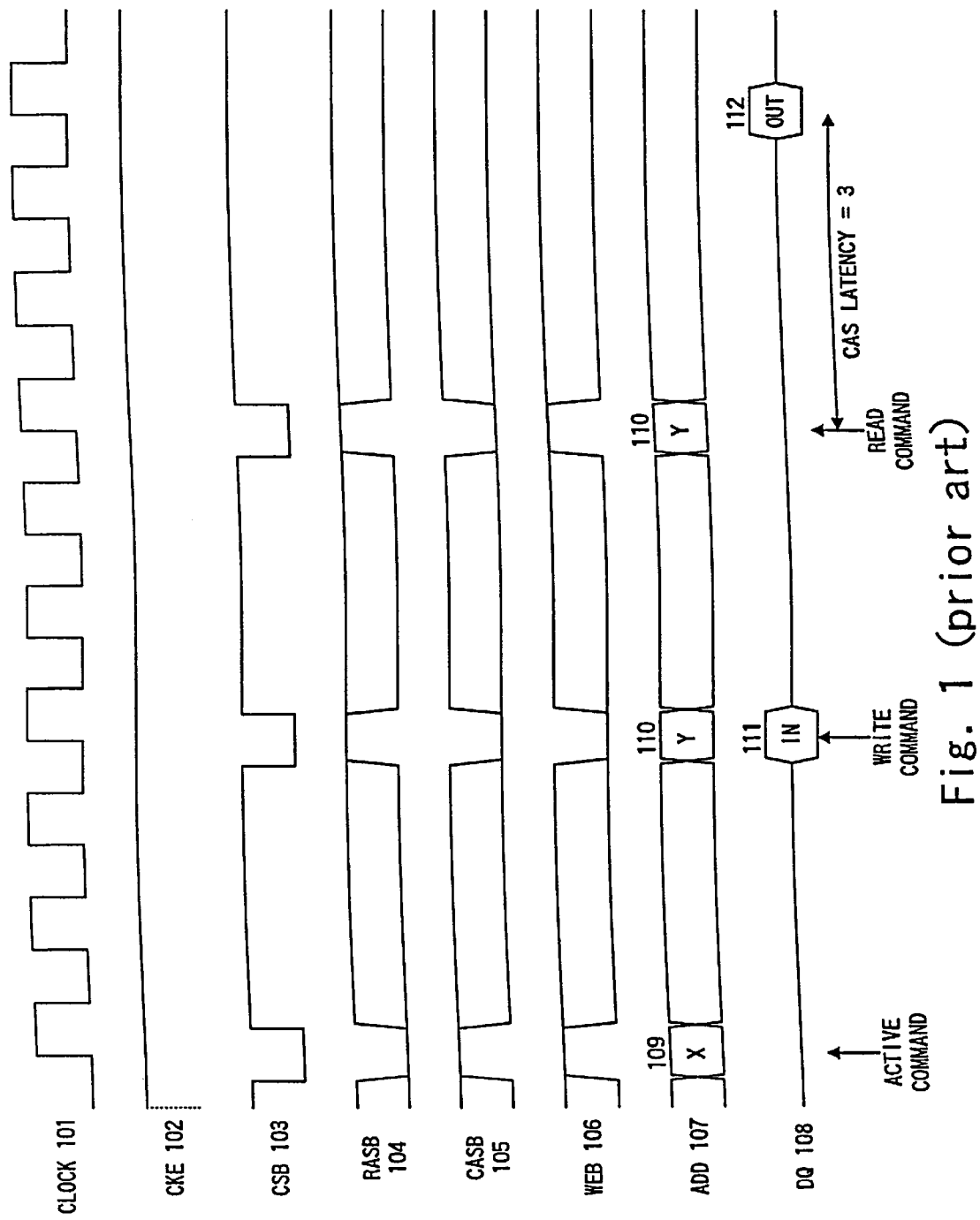
FIG. 1 is a timing chart of operation of the SDRAM according to the prior art.
Figure 2:
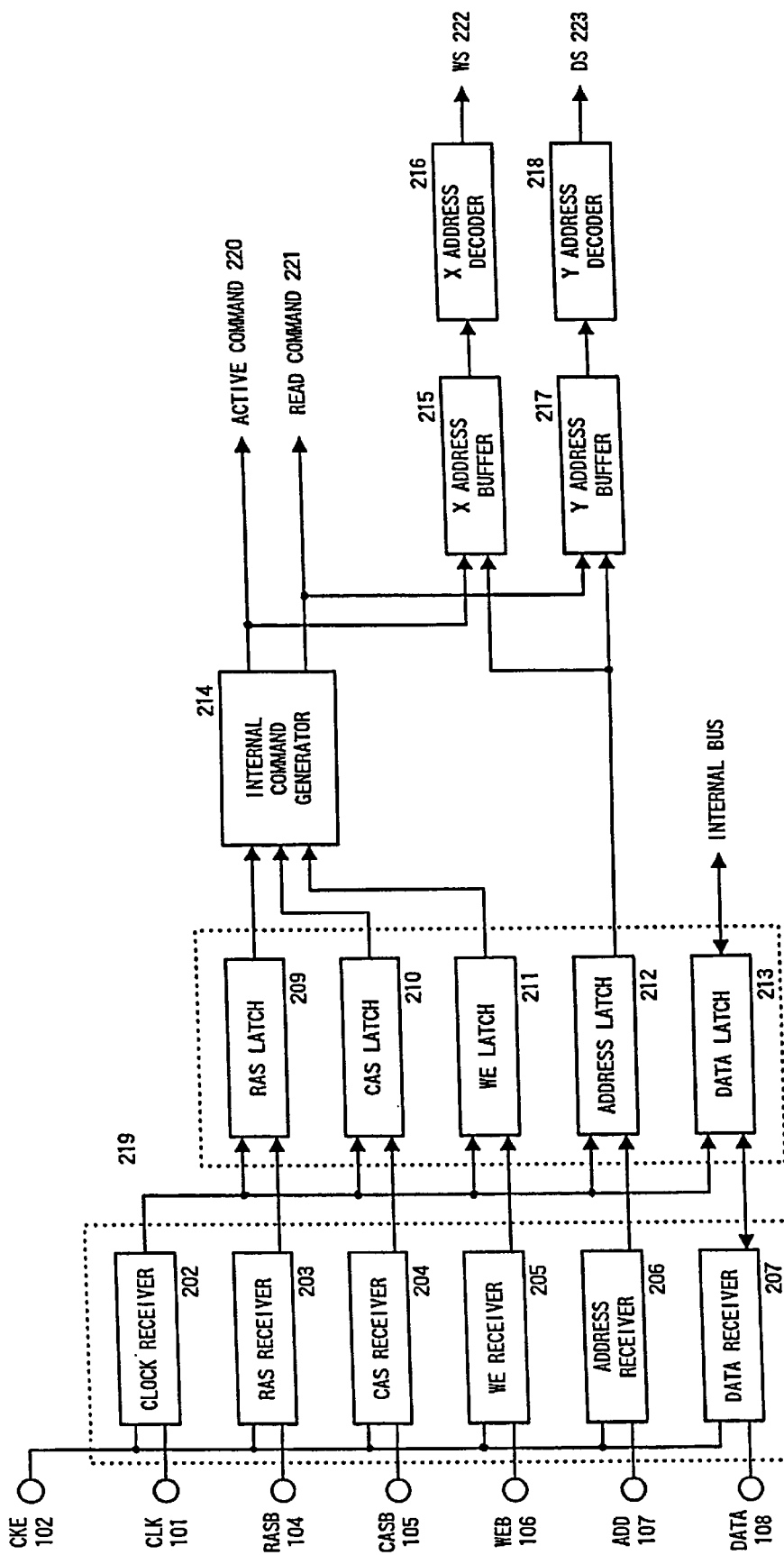
FIG. 2 is a diagram of generating method of internal commands of the SDRAM according to the prior art.
Figure 3:
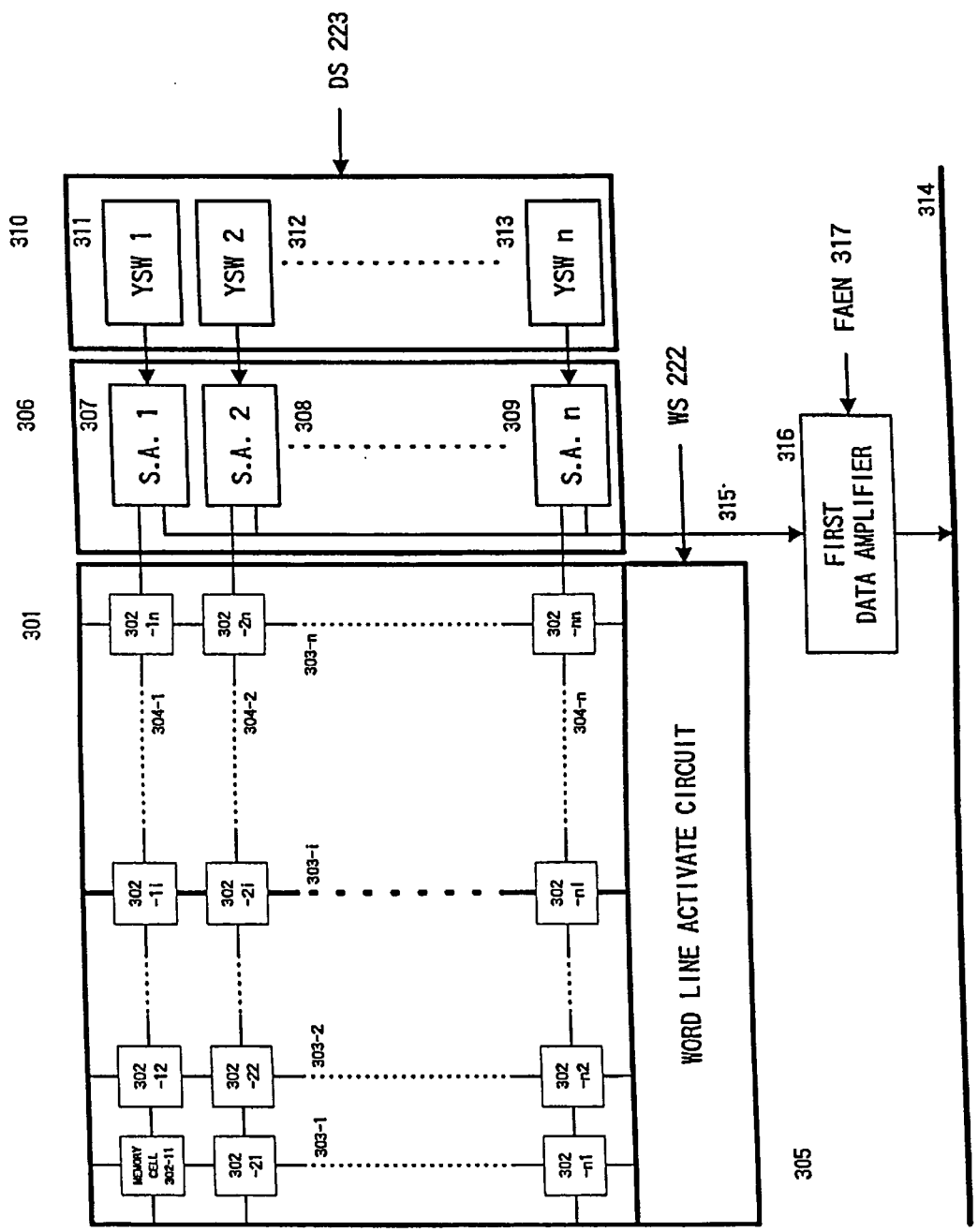
FIG. 3 is a circuit diagram of a memory block according to the prior art.
Figure 4:
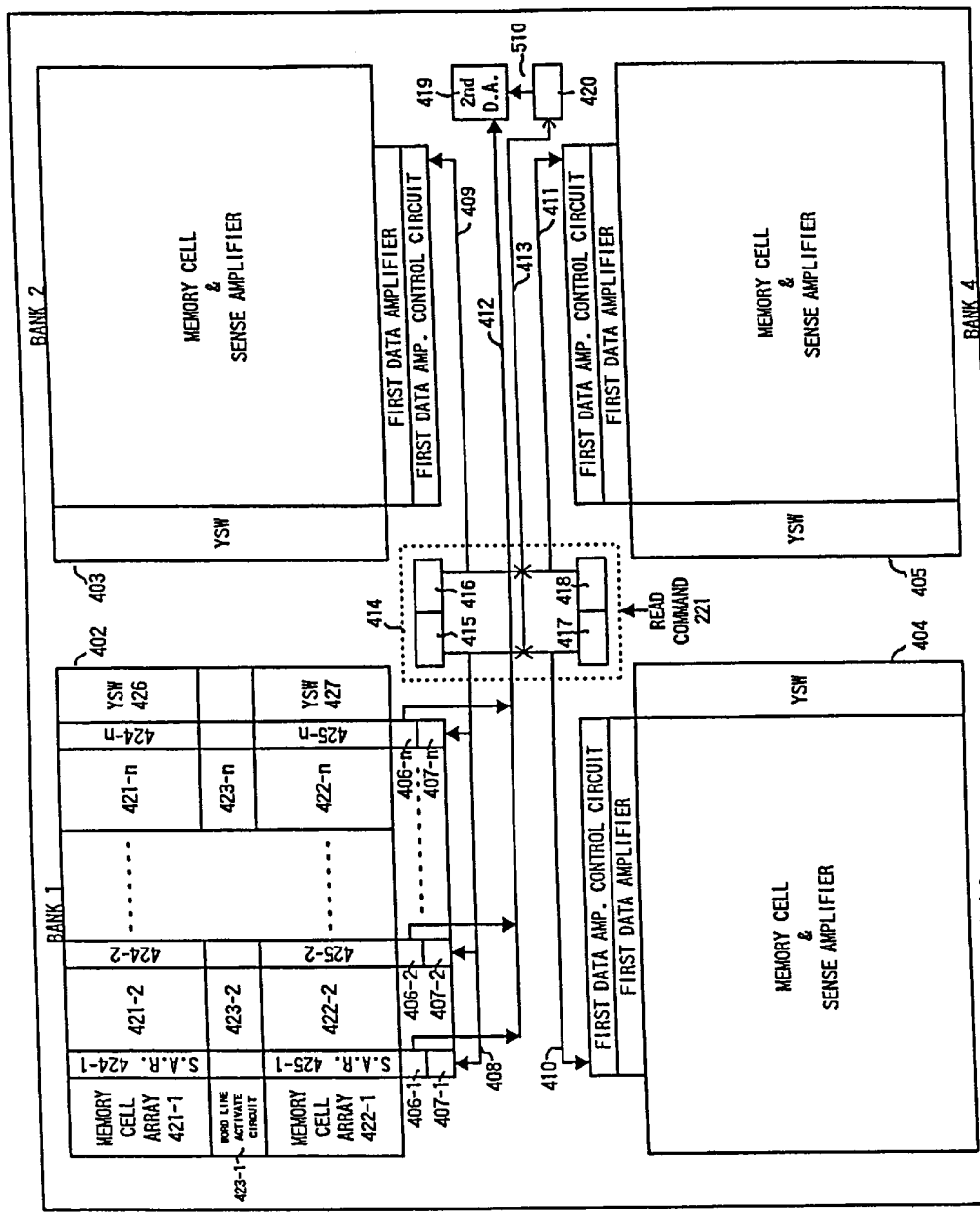
FIG. 4 is a circuit diagram of a memory device according to the prior art.
Figure 9:
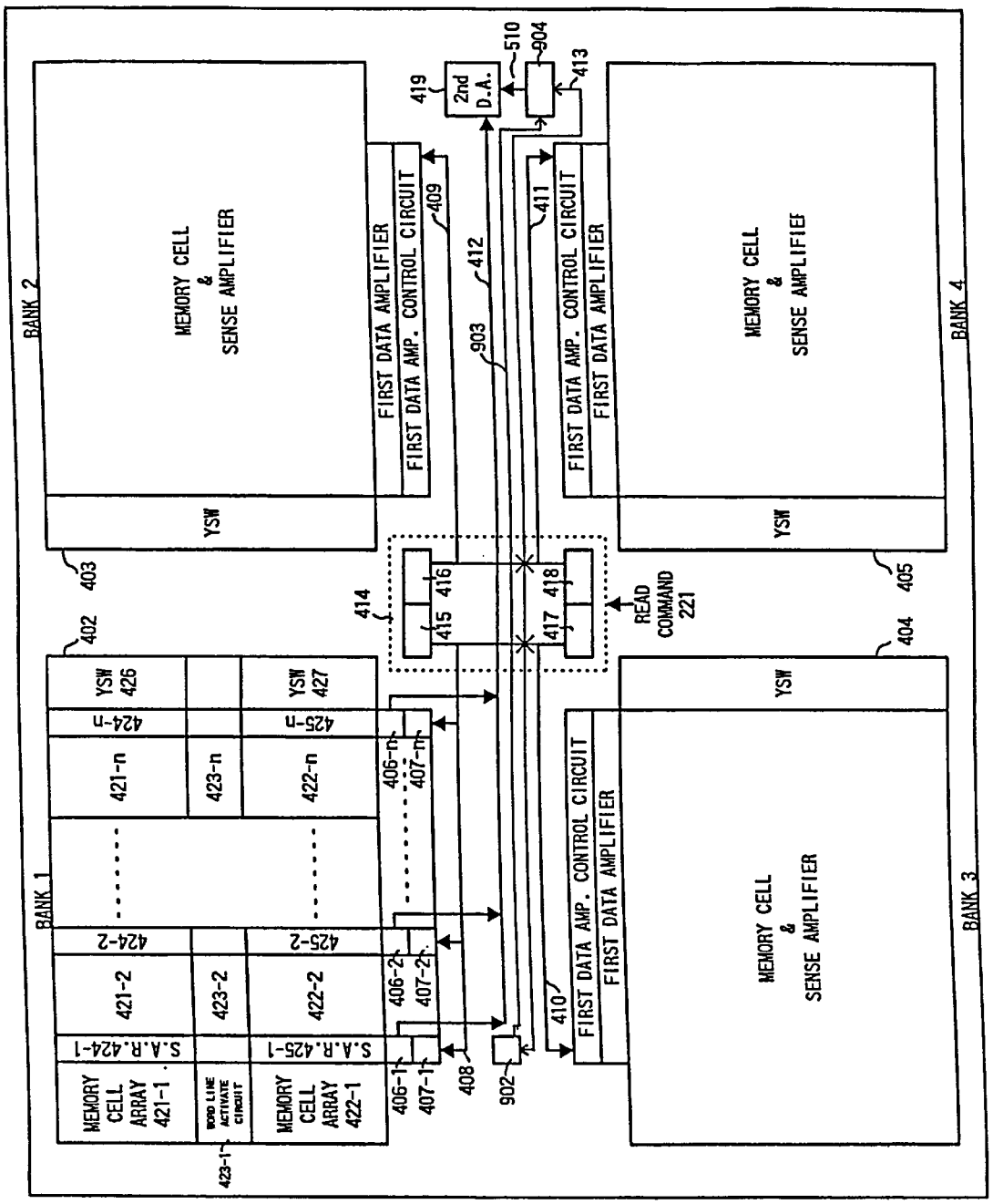
FIG. 9 is a circuit diagram of a memory device according to the present invention.

Referring now to FIG. 9, there is shown a memory device in accordance with an embodiment of the present invention, in which the same constituents as those shown in FIG. 4 is denoted by the same reference numerals or symbols to omit the further description thereof In this memory device 901, there is provided a control signal line for a delay control signal 903 which has a equivalent wiring delay to a data signal line, or RWBUS 412. Also, an operating stage in which the read-out data is inputted to the first data amplifier in response to the command signals 101–108 from an exterior (refer to FIG. 2) and the FAS 408–411 and SAS 413 is outputted from the read control circuit 414 in response to the read command 221 are equivalent to those of the prior art. In the prior memory device 401, the second data amplifier control circuit 420 is only received the SAS 413. However, the second data amplifier control circuit 904 of the present invention is received the SAS 413 and the delay control signal 903. The delay control signal 903 fills the role of the delay circuit 504 of the prior second data amplifier control circuit 503. In short, a generating timing of the SAEN 510 is controlled by the delay control signal 903. The delay control signal 904 is generated by a pseudo amplifier control circuit 902 which is received a SAS 413. In this embodiment, the pseudo amplifier control circuit 902 arranges near the first amplifier control circuit 407-1 which arranges at the most distant from the second data amplifier 419 and this includes of the same circuit configuration as those of the first amplifier control circuit.

Figure 5:
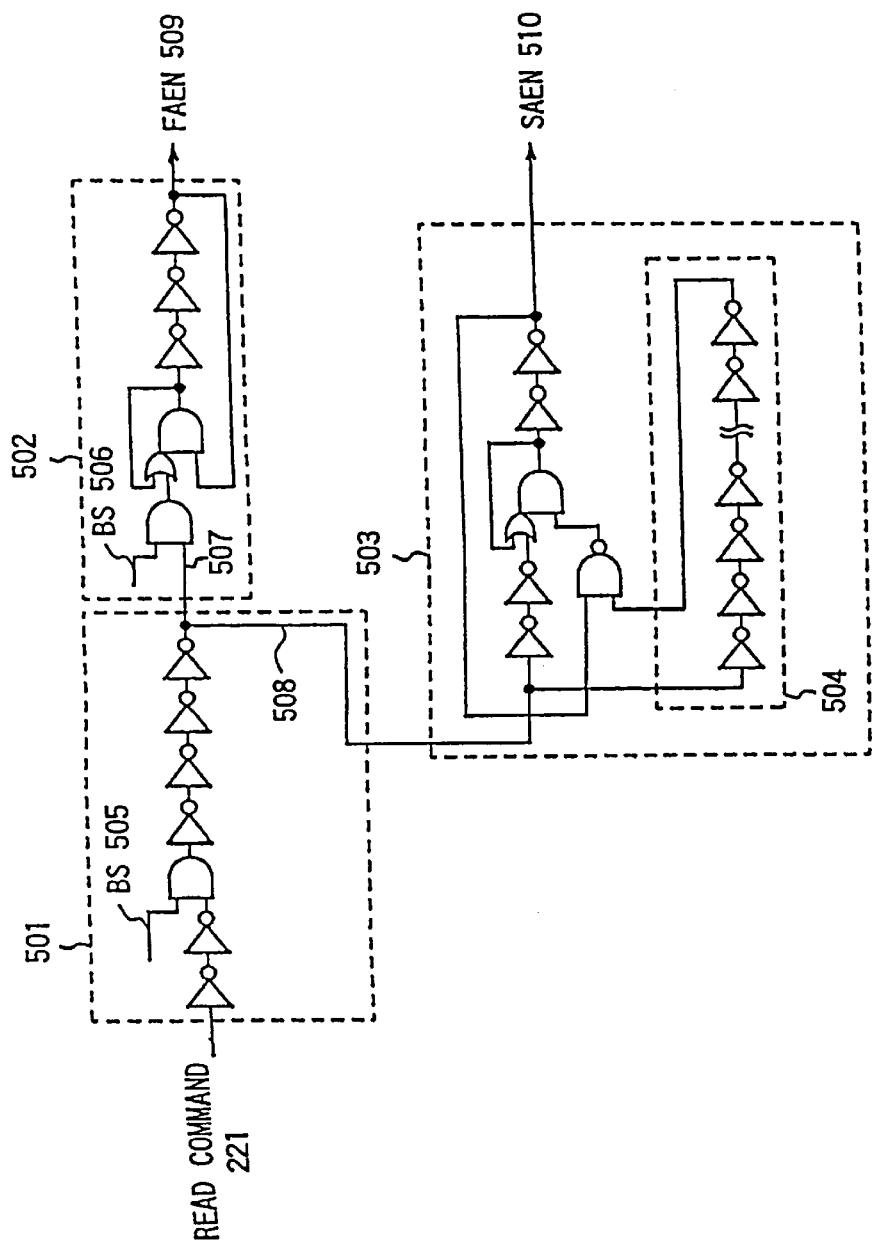
FIG. 5 is a circuit diagram of a read control circuit, a first data amplifier control circuit and a second data amplifier control circuit according to the prior art.
Figure 6:
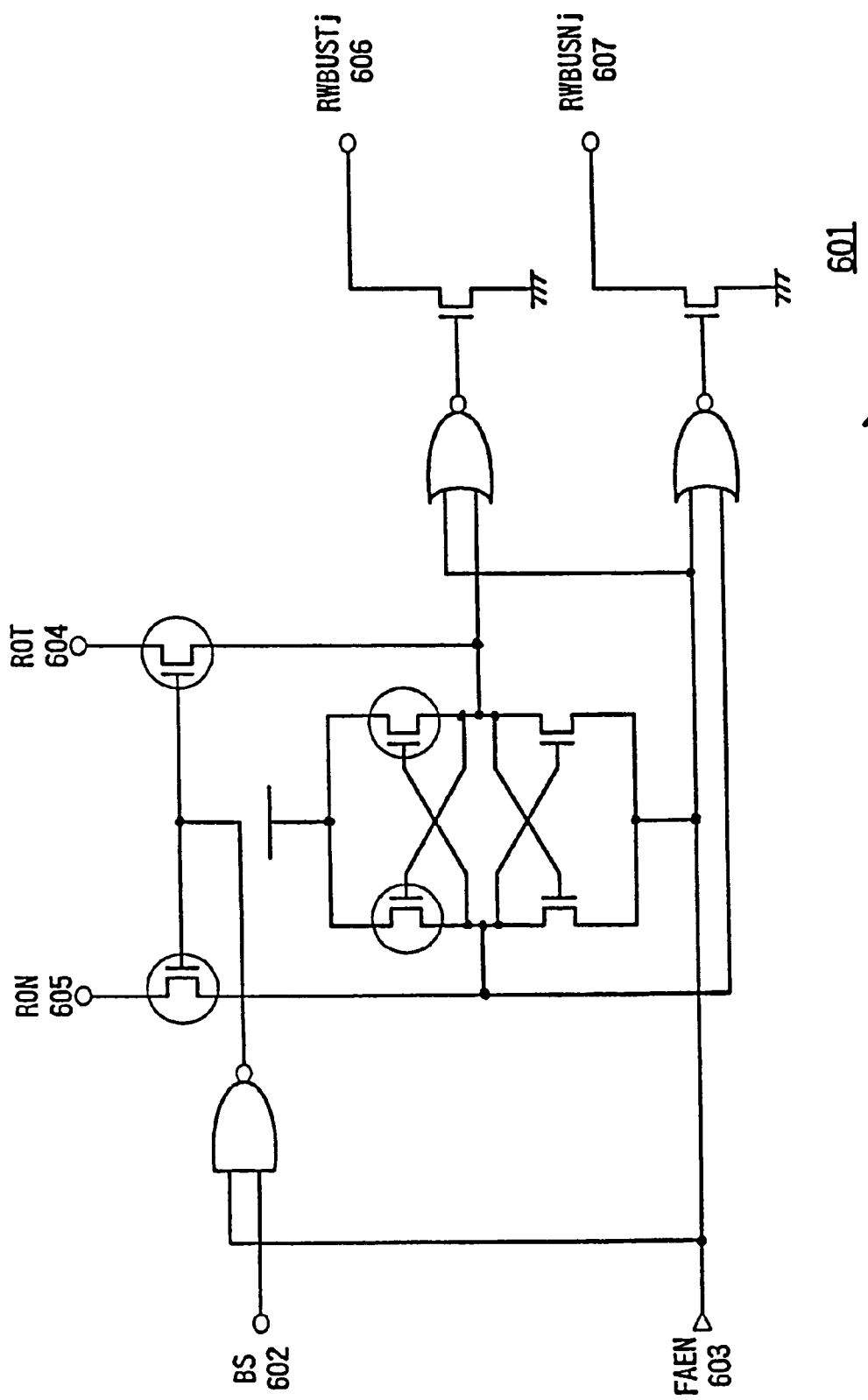
FIG. 6 is a circuit diagram of a first data amplifier according to the prior art.
Figure 7:
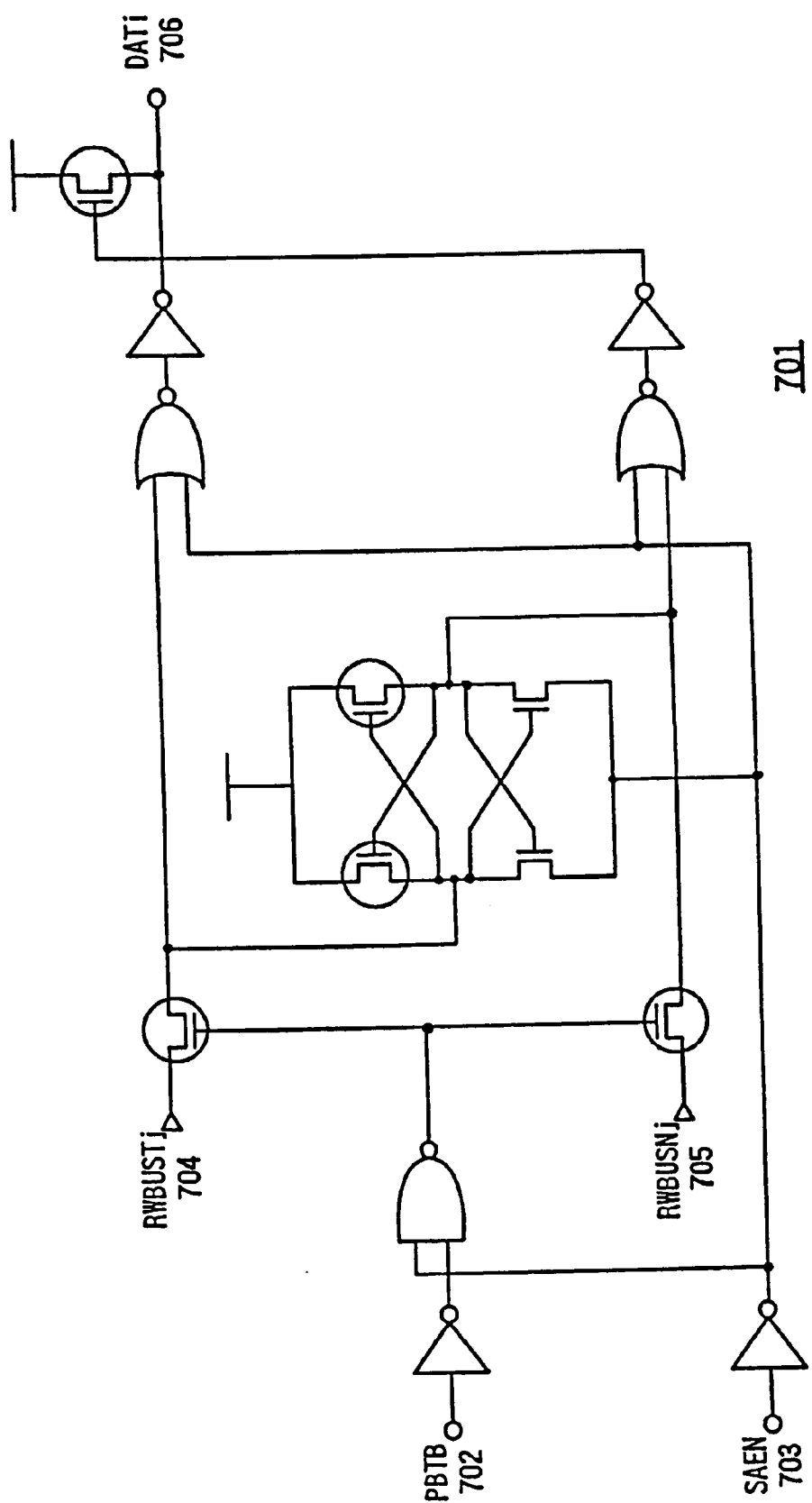
FIG. 7 is a circuit diagram of a second data amplifier according to the prior art.
Figure 8:
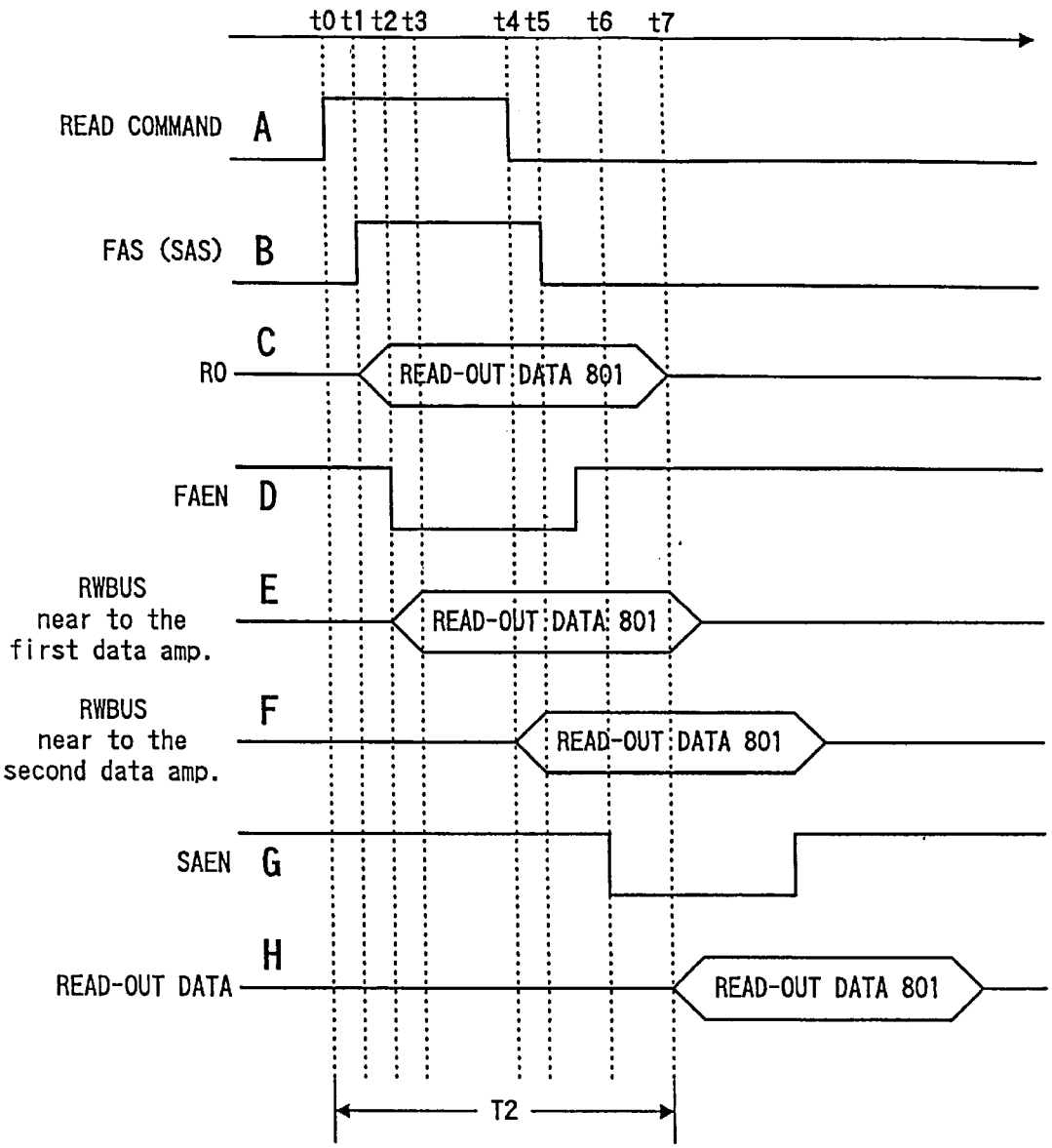
FIG. 8 is a timing chart of a memory device according to the prior art.
Figure 10:
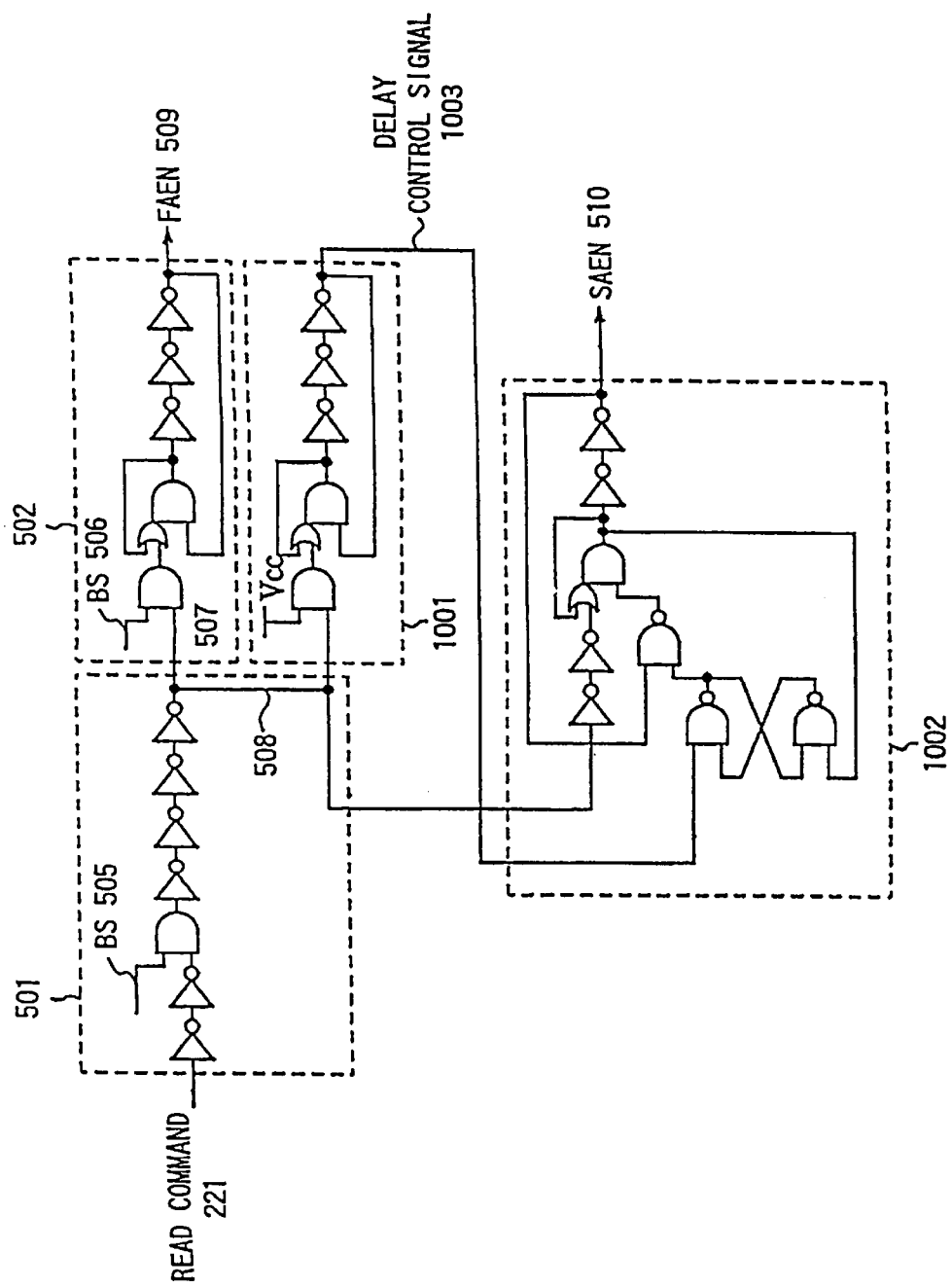
FIG. 10 is a circuit diagram of a read control circuit, a first data amplifier control circuit, a pseudo amplifier control circuit and a second data amplifier control circuit according to the present invention.

Referring now to FIG. 10, there is shown a circuit diagram of the read control circuit 501, the first data amplifier control circuit 502, the pseudo amplifier control circuit 1001 and the second data amplifier control circuit 1002. The read control circuit 501 and the first data amplifier control circuit 502 has the same circuit configuration of the prior art. The second data amplifier control circuit 1002 does not include the delay circuit for finely adjusting a delay time of the SAEN 510. In place of it, as apparent from the comparison with FIG. 5, in the embodiment, there are newly added the pseudo amplifier control circuit 1001 constructed to have the same circuit configuration as that of the first amplifier control circuit 502 and a pseudo RWBUS 1003 as the delay control signal line. Accordingly, the pseudo amplifier control circuit 1001 outputs the delay control signal 903 at the same timing of generating the FAEN 509. In this time, the second data amplifier control circuit 1002 has been received the SAS 508 and generates the SAEN 510 in response to the delay control signal 903. Therefore, the activating time of the second data amplifier is optimistically set.

Figure 11:
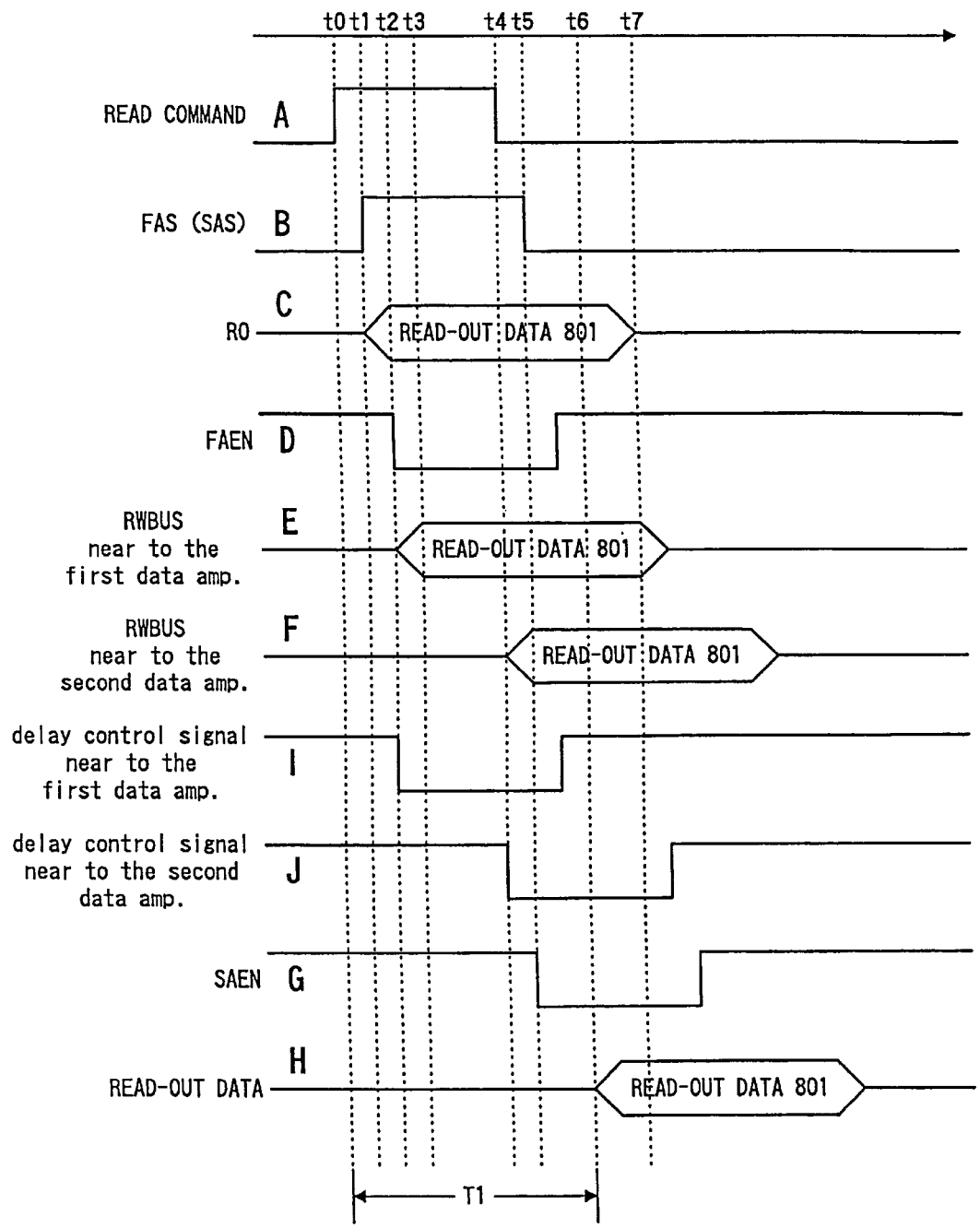
FIG. 11 is a timing chart of a memory device according to the present invention.

Referring now to FIG. 11, there is shown a timing chart of the memory device of the embodiment. Assuming that the read command is generated at a timing t0 (A), the FAS and SAS is generated at a timing t1 (B) by the read control circuit 501. At the same time, the memory bank is activated in response to the read command, since the RO is also activated (C). In other words, the read-out data 801 is transferred to the first data amplifier. While the FAEN is generated at a timing t2 (D) by the first data amplifier control circuit 502. Accordingly, the read-out data is transferred to RWBUS in response to the FAEN (E). Then, the read-out data 801 arrives to the second data amplifier at a timing t4 through the RWBUS (F). In this connection, the read-out data is decided at a timing t5. On the other hands, the delay control signal is generated at a timing t2 (I) by the pseudo amplifier control circuit 1001. Accordingly, the delay control signal is transferred on the pseudo RWBUS 1003 has the same wiring delay to the RWBUS. Therefore, the second data amplifier control circuit 1002 is received the delay control signal at a timing t4 (J) and generates the SAEN at a timing t5 (G). As a result, the read-out data 801 is transferred to data latch 213 (refer to FIG. 2) and outputted (H) at a timing t6. That is, a read-out time of the embodiment T1 in which the read-out data 801 is outputted is expressed by T1=(t6–t0).

Shown in FIG. 9, the pseudo amplifier control circuit 902 arranges near the first amplifier control circuit 407-1. Accordingly, in the case that data is read out from the memory block 421-1 of the bank 1, a time until the SAS reaches the pseudo amplifier control circuit 902 becomes the same time as the time until the FAS reaches the first data amplifier control circuit 407-1. In addition, the pseudo amplifier control circuit 902 is constructed to have the same circuit configuration as that of the first data amplifier control circuit 407-1, thereby a time until the delay control signal is generated in the pseudo amplifier control circuit 902 becomes the same as a time until the FAEN is generated in the first data amplifier control circuit 407-1. In this case, as mentioned above, the wiring delay of the read-out data is equivalent to the wiring delay of the delay control signal. Accordingly, when at the second data amplifier control circuit 904 is received the SAS 413 to generate the SAEN 510 and outputted thereof in response to the inputting of the delay control signal 903, in the second data amplifier 419, the data on the RWBUS 412 is inputted at a substantial same time just before the inputting of the SAEN 510. Thereby the data is normally amplified without any surplus delay in time as the read-out data and further inputted to the data latch 213.

In this embodiment, the RWBUS 412 is formed by the aluminum, the length is 14000 μm and the width is 1.6 μm, thereby the delay time of the RWBUS 412 (t3–t5) is about 2 ns. On the other hand, both a time until the FAEN reaches the first data amplifier 406 and a time until the read-out data is outputted from the first data amplifier 406 onto the RWBUS 412 (t2–t3) is about 0.4 ns. Also, the pseudo RWBUS is formed by the aluminum, the length is 14000 μm and the width is 2.4 μm. However, the delay time of the pseudo RWBUS (t2–t4) is about 2 ns too. Because the RWBUS 412 is connected many transistors of the plurality of the first data amplifiers. In addition, a generating period of the SAEN in the second data amplifier control circuit 904 (t4–t5) is about 0.4 ns. Therefore, the generating timing of the SAEN 510 is controlled optimistic.

In the present embodiment as above, the read-out time T1 is becomes (t6–t0), while the read-out time t2 of the prior art is becomes (t7–t0) and apparently the relation of T2>T1 can be attained. That is, in accordance with the present invention, the data read-out time from the memory block is shortened. In addition, the timing in which the SAEN is inputted to the second data amplifier is coincided with the timing in which the read-out data from the memory block which arranges at the most distant from the second data amplifier is inputted to the second data amplifier, thereby the data read-out speed can be increased up to its limit value.

As to the applied raw material and size of the aforesaid pseudo RWBUS, the present invention can be effectively functioned under a definition in which a deviation of resistivity between the applied raw material and the applied raw material of the RWBUS is set to be less than ±50% and a size deviation between a wiring length and a wiring width is set to be less than ±50%, respectively.

It is apparent that the present invention is not limited to the illustrated embodiment, but may be modified and changed without departing from the scope and spirit of this invention. For example, the present invention can be applied to DRAM and SRAM, etc.

What is claimed is:

1. A semiconductor memory device comprising:

a memory cell array including a plurality of memory cells, a selection circuit selecting one of said memory cells and reading out data therefrom in response to a control signal transferred via a first control line, a data amplifier provided apart from said memory cell array, a data bus provided between said selection circuit and said data amplifier to transfer said data from said memory cell array to said data amplifier, a second control line provided independently of said first control line to be substantially in parallel to said data bus, a control signal generator supplying said control signal to one end portion of said second control line, said second control line thereby providing a delayed control signal at the other end portion thereof, and a control circuit responding to said delayed control signal and allowing said data amplifier to respond to the data transferred via said data bus, wherein said one end portion of said control line is adjacent to one end portion of said data bus, and said data amplifier is coupled to the other end portion of said data bus.

2. The memory device as claimed in claim 1, wherein said control signal generator supplies said control signal to one end portion of said control line at a first timing, said selection circuit outputs said read out data to said data bus at a second timing, said first timing and said second timing are equivalent in timing.

3. A semiconductor memory device comprising:

a first memory cell array including a first data amplifier and a plurality of first memory cells, a second data amplifier disposed apart from said memory cell array, a data bus line having one end portion connected to said second data amplifier and elongating to have the other end portion disposed adjacently to said first memory cell array, a select control circuit disposed between said memory cell array and said second data amplifier and generating a first control signal, a selection circuit selecting one of said first memory cells in response to address information, said first data amplifier being activated by said first control signal and transferring data, which is stored in said one of said first memory cells selected by said selection circuit, to said data bus line, a pseudo control circuit disposed adjacently to said first data amplifier and receiving said first control signal to produce a pseudo control signal, and a signal line connected to said pseudo control circuit to receive said pseudo control signal and being elongated along said data bus line and said select control circuit to reach said second data amplifier to transfer said pseudo control signal to said second data amplifier.

4. The memory device as claimed in claim 3, wherein said second data amplifier includes:

a data amplification circuit connected to said one end portion of said data bus, and a second control circuit connected to said signal line, wherein said second control circuit responds to said pseudo control signal to activate said data amplification circuit.

5. The memory device as claimed in claim 4, wherein said first data amplifier includes:

an amplification circuit receiving said data, and a third control circuit responding to said first control signal to activate said amplification circuit to allow said data to be transferred to said other end portion of said data bus line.

6. The memory device as claimed in claim 3, further comprising a second memory cell array disposed between said second data amplifier and said select control circuit, said second memory cell array including:

a third data amplifier, and a plurality of second memory cells;

wherein said select control circuit further generates a second control signal, said selection circuit further selects one of said second memory cells in response to other address information, said third data amplifier being activated by said second control signal and transferring data, which is stored in said one of said second memory cells selected by said selection circuit, to said data bus line.

* * * * *